(12) United States Patent
Pan et al.

(10) Patent No.: US 11,855,054 B2
(45) Date of Patent: Dec. 26, 2023

(54) METHOD OF FORMING PACKAGE STRUCTURE

(71) Applicant: Taiwan Semiconductor Manufacturing Company, Ltd., Hsinchu (TW)

(72) Inventors: Chih-Chien Pan, Taipei (TW); Chin-Fu Kao, Taipei (TW); Li-Hui Cheng, New Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/717,110

(22) Filed: Apr. 10, 2022

(65) Prior Publication Data

US 2022/0231005 A1 Jul. 21, 2022

Related U.S. Application Data

(62) Division of application No. 16/836,927, filed on Apr. 1, 2020, now Pat. No. 11,302,683.

(51) Int. Cl.
*H01L 25/16* (2023.01)
*H01L 23/00* (2006.01)
(Continued)

(52) U.S. Cl.
CPC .............. *H01L 25/167* (2013.01); *G02B 6/13* (2013.01); *H01L 21/561* (2013.01); *H01L 23/24* (2013.01);
(Continued)

(58) Field of Classification Search
CPC ..... H01L 25/167; H01L 21/561; H01L 23/24; H01L 24/16; H01L 2224/16145; H01L 2224/0239; H01L 2224/056; H01L 2224/05624; H01L 2224/05644; H01L 2224/05647; H01L 2224/05655; H01L 2224/131; H01L 2224/13111; H01L 2224/13124; H01L 25/0657; H01L 25/50; H01L 2224/0401; H01L 2224/05548; H01L 2224/11334; H01L 2224/13082; H01L 2224/13116; H01L 2224/13139; H01L 2224/13144; H01L 2224/13147; H01L 2224/13155; H01L 2224/13164; H01L 2224/16147; H01L 2224/16227; H01L 2224/17181; H01L 2224/2919; H01L 2224/32013; H01L 2224/32145; H01L 2224/33181; H01L 2224/73204;
(Continued)

(56) References Cited

U.S. PATENT DOCUMENTS

2019/0148340 A1* 5/2019 Yu ........................... H01L 25/50
257/737

* cited by examiner

*Primary Examiner* — Kyoung Lee
*Assistant Examiner* — Christina A Sylvia
(74) *Attorney, Agent, or Firm* — JCIPRNET

(57) ABSTRACT

A package structure and methods of forming a package structure are provided. The package structure includes a first die, a second die, a wall structure and an encapsulant. The second die is electrically bonded to the first die. The wall structure is located aside the second die and on the first die. The wall structure is in contact with the first die and a hole is defined within the wall structure for accommodating an optical element. The encapsulant laterally encapsulates the second die and the wall structure.

20 Claims, 18 Drawing Sheets

(51) Int. Cl.
*H01L 21/56* (2006.01)
*G02B 6/13* (2006.01)
*H01L 23/24* (2006.01)

(52) U.S. Cl.
CPC .... *H01L 24/16* (2013.01); *H01L 2224/16145* (2013.01)

(58) Field of Classification Search
CPC ....... H01L 2224/94; H01L 2225/06534; H01L 2225/06541; H01L 2225/06568; H01L 21/563; H01L 23/3121; H01L 2224/16237; H01L 2224/32225; H01L 2224/9202; H01L 2225/06513; H01L 2225/06517; H01L 2924/18161; G02B 6/13; G02B 6/4201

See application file for complete search history.

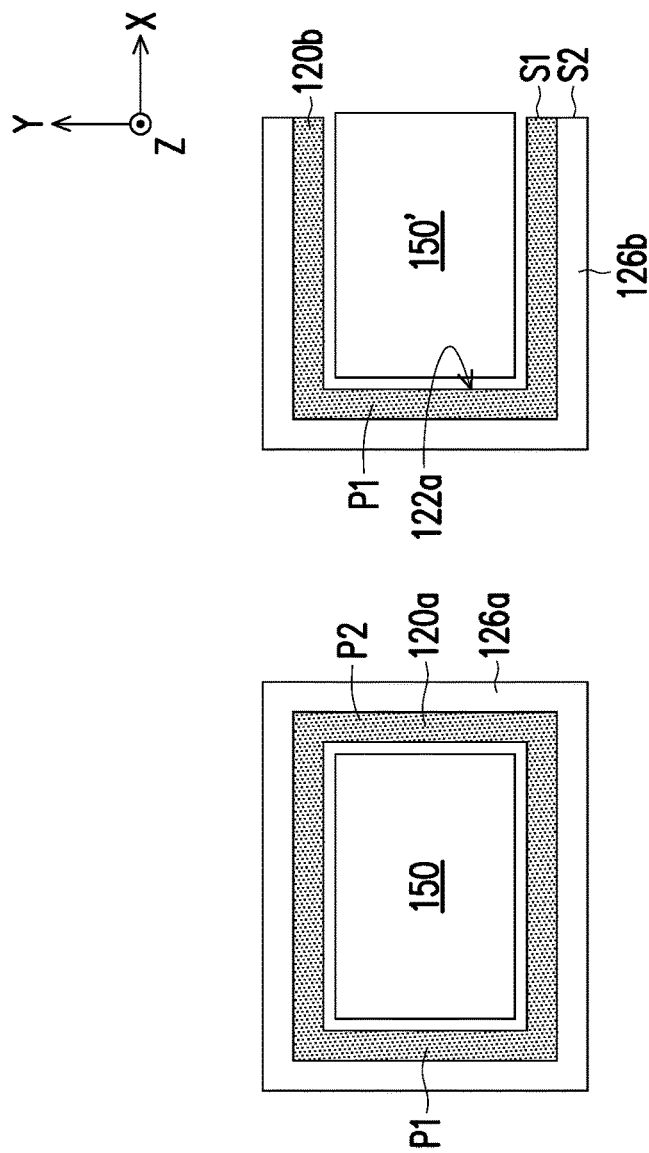
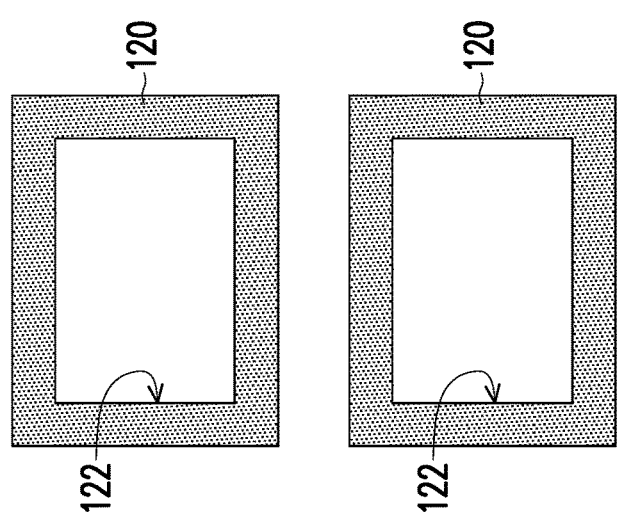
FIG. 3A   FIG. 3B   FIG. 3C

METHOD OF FORMING PACKAGE STRUCTURE

CROSS-REFERENCE TO RELATED APPLICATION

This application is a divisional application of and claims the priority benefit of a prior application Ser. No. 16/836,927, filed on Apr. 1, 2020 and now allowed. The entirety of the above-mentioned patent application is hereby incorporated by reference herein and made a part of this specification.

BACKGROUND

Optical signal processing has been widely used in many applications in recent years, particularly the use of optical fiber-related applications for signal transmission.

Optical signal processing may be combined with electrical signal processing for full-fledged signal processing. For example, optical fibers may be used for long-range signal transmission, and electrical signals may be used for short-range signal transmission as well as for processing and controlling. Accordingly, devices incorporating optical components and electrical components, or packages including both of optical dies and electronic dies are used for the conversion between optical signals and electrical signals, and for the processing of optical signals and electrical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates a top view of a wall structure according to some embodiments of the disclosure.

FIG. 3B and FIG. 3C are partial top views of a package structure according to some embodiments of the disclosure.

DETAILED DESCRIPTION

Figure 1A:
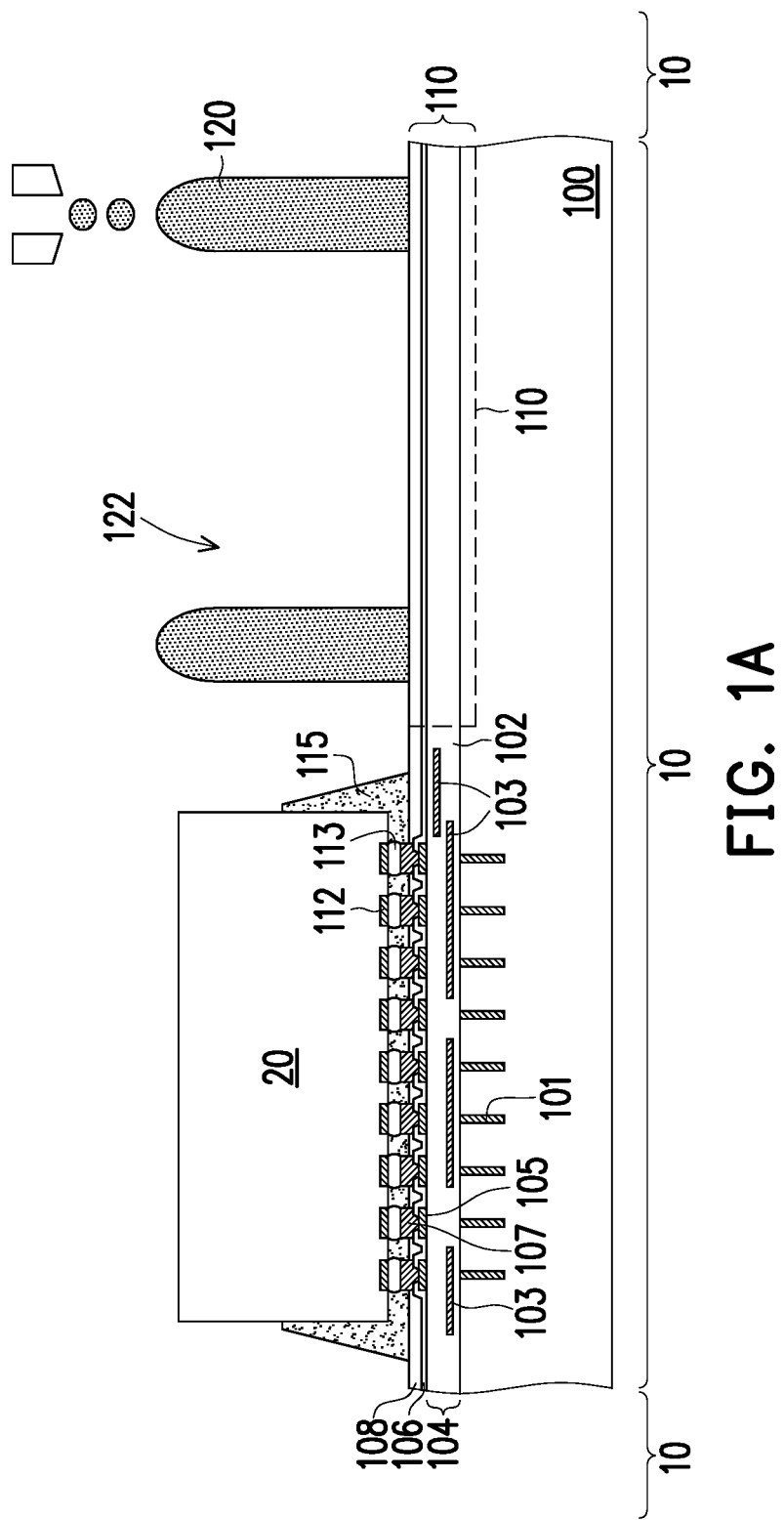
FIG. 1A to FIG. 1K are schematic cross-sectional views illustrating a method of manufacturing a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic cross-sectional views illustrating a method of manufacturing a package structure according to a first embodiment of the disclosure.

Referring to FIG. 1A, a die 10 is provided, the die 10 may be provided as one of the dies included in a wafer. The wafer may include a plurality of substantially identical dies 10 arranged as an array, and the number of the dies 10 is not limited in the disclosure. In some embodiments, the die 10 is a photonic die which has function of receiving optical signals, transmitting the optical signals inside photonic die, transmitting the optical signals out of photonic die 10, and communicating electronically with electronic die 20. Accordingly, photonic die 10 is also responsible for the Input-Output (IO) of the optical signals.

In some embodiments, the die 10 includes a substrate 100, a plurality of conductive vias 101, an interconnection structure 104, conductive pads 105, connectors 107 and passivation layers 106 and 108. The substrate 100 may be made of semiconductor, glass, ceramic, or dielectric. For example, the substrate 100 may include a bulk semiconductor substrate or the like, which may be doped (e.g., with a p-type or an n-type dopant) or undoped. In some embodiments, the substrate 100 is a silicon substrate or other type of semiconductor substrate. Other types of substrate, such as a multi-layered or gradient substrate may also be used. In some embodiments, the material of the substrate 100 may include silicon, germanium, a compound semiconductor including silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP, the like, or combinations thereof.

In some embodiments, the substrate 100 has a plurality of integrated circuit devices formed therein and/or thereon. The devices may be active devices, passive devices, or combinations thereof. In some embodiments, the devices include, for example, transistors, capacitors, resistors, diodes, photodiodes, fuse devices, photonic devices or the like, or combinations thereof. In some other embodiments, the die 10 is free of active devices while including passive devices.

The interconnection structure 104 is formed over the devices of the substrate 100. In some embodiments, the interconnection structure 104 includes multi-layers of conductive features 103 formed in a dielectric structure 102. The conductive features 103 electrically connect the devices in and/or on the substrate 100, so as to form a functional circuit. The dielectric structure 102 may include a plurality of dielectric layers. In some embodiments, the dielectric structure 102 is an inorganic dielectric structure. Alternatively, the dielectric structure 102 may include organic dielectric material. For example, the material of the dielectric structure 102 may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), $SiO_xC_y$, Spin-On-Glass, Spin-On-Polymers, silicon carbon material, compounds thereof, composites thereof, combinations thereof, or the like.

The conductive features 103 may include multiple layers of metal lines and vias (not shown) interconnected to each other. The metal lines and vias include conductive materials, such as metal, metal alloy or a combination thereof. For example, the conductive material may include tungsten (W), copper (Cu), copper alloys, aluminum (Al), aluminum alloys, or combinations thereof.

The pads 105 may be electrically connected to a top conductive feature of the interconnection structure 104, and further electrically connected to the devices formed on the substrate 100 through the interconnection structure 104. The material of the pads 105 may include metal or metal alloy, such as aluminum, copper, nickel, or alloys thereof.

The passivation layer 106 is formed over the substrate 100 and covers a portion of the pads 105. The material of the passivation layer 106 may include silicon oxide, silicon nitride, silicon oxynitride, or a combination thereof. Alternatively, the passivation layer 106 may include a polymer material such as photosensitive polybenzoxazole (PBO), polyimide (PI), benzocyclobutene (BCB), a combination thereof, and/or the like. Portions of the pads 105 are exposed by the passivation layer 106 for further electrical connection. The connectors 107 are formed on and electrically connected to the pads 105 exposed by the passivation layer 106. The connector 107 includes solder bumps, gold bumps, copper bumps, copper posts, copper pillars, or the like. The passivation layer 108 is formed on the passivation layer 106 and laterally aside the connectors 107. The material of the passivation layer 108 may be selected from the same candidate material of the passivation layer 106. The passivation layer 108 may partially or completely cover sidewalls of the connectors 107.

In some embodiments, the die 10 includes a plurality of conductive vias 101. The conductive vias 101 are formed in the substrate 100 and electrically connected to the conductive features 103 of the interconnect structure 104. In some embodiments, the conductive via 101 includes a conductive post and a liner (not shown) surrounding the sidewalls and bottom surface of the conductive via to separate the conductive post from the substrate 100. The conductive post may include copper, copper alloys, aluminum, aluminum alloys, Ta, TaN, Ti, TiN, CoW or combinations thereof. The liner may include dielectric material, such as silicon oxide, silicon nitride, or the like. The conductive vias 101 may extend from the interconnect structure 104 to be in physical and electrical contact with the conductive features 103 of the interconnect structure 104. In some embodiments, the conductive vias 101 are embedded in the substrate 100 without being revealed at this point.

Still referring to FIG. 1A, in some embodiments in which the die 10 is a photonic die, the die 10 includes a photonic element region 110 (the region outlined in dashed line) over the substrate 10. The dielectric features (e.g. the dielectric structure 102 and the passivation layers 106, 108) may also extend to photonic element region 110. Various optical elements (not shown) may be disposed in the photonic element region 110 and/or other suitable region of the die 10. For example, the optical elements may include waveguides, grating couples, modulators and/or the like. In some embodiments, a silicon layer may be formed over the substrate 100 severing as waveguide(s) for the internal transmission of optical signals, grating coupler(s) may be disposed on the waveguides and have the function of receiving and/or transmitting optical signal (e.g. light). For example, the grating coupler may receive optical signal from subsequently mounted overlying optical element (e.g. the optical element 150 shown in FIG. 1K, such as light source or optical signal source (e.g. optical fiber)) and transmit the optical signal to waveguide. Alternatively, the grating coupler may receive optical signal from the waveguide and transmit the optical signal to overlying optical element. Modulator(s) may also be formed on the silicon layer, and are used for modulating the optical signals. It is appreciated that the die 10 may include various other devices and circuits that may be used for processing and transmitting optical signals and electrical signals, which are also contemplated in accordance with some embodiments of the disclosure.

Still referring to FIG. 1A, a die 20 is electrically bonded to the die 10 through the bonding connectors 113. In some embodiments, the bonding connectors 113 include solder bumps. In some other embodiments, the die 20 may be electrically bonded to the die 10 through fusion bonding, hybrid bonding or a combination thereof. The die 20 may be application-specific integrated circuit (ASIC) chip, a system on chip (SoC), an analog chip, a sensor chip, a wireless and radio frequency chip, a voltage regulator chip, a memory chip or the like or any suitable type of die. In some embodiments, the die 20 is an electronic die, and acts as a central processing unit, which includes the controlling circuit for controlling the operation of the devices in photonic die 10. In addition, the die 20 may include the circuits for processing the electrical signals converted from the optical signals in the photonic die 10. The die 20 may also exchange electrical signals with photonic die 10 through bonding connectors 113, for example.

In some embodiments, the die 20 includes a plurality of connectors 112. The material of the connectors 112 may be selected from the same candidate materials of the connectors 107. The bonding connectors 113 are disposed between the connectors 112 and the connectors 107 to provide the electrical connection between the die 20 and the die 10. Similar to the die 10, the die 20 may also include a semiconductor substrate, various devices, an interconnection structure and a plurality of conductive pads and passivation layers (no shown), and the material and structure of these components are similar to those described with respect to the die 10. In some embodiments, the die 20 is bonded to the die 10 in a face-to-face configuration, and the back side (i.e. substrate) of the die 20 faces upward, but the disclosure is not limited thereto. It is noted that, one die 20 is shown to be bonded to the die 10 for illustration, but the disclosure is not limited thereto. According to some embodiments of the disclosure, a plurality of dies may be bonded to the die 10, the number of the dies is not limited in the disclosure, and the plurality of dies may be the same type of the dies or different types of dies.

An underfill layer 115 may be formed to fill the space between the die 20 and the die 10 and laterally surround the connectors 107, the bonding connectors 113 and/or the connectors 112. In some embodiments, the underfill layer 115 may further extend to cover sidewalls of the die 20.

Still referring to FIG. 1A, a wall structure 120 is formed on the die 10. In some embodiments, the wall structure 120 includes polymer material and may also be referred to as a polymer wall. For example, the polymer material may include PI, acrylic, epoxy, or the like, or combinations thereof. In some embodiments, the material of the wall structure 120 is free of filler. However, the disclosure is not limited thereto. In some other embodiments, polymer material having fillers distributed therein may also be used. The forming method of the wall structure 120 may include dispensing and curing processes. FIG. 3A illustrates a top view of the wall structure 120 according to some embodiments of the disclosure. Referring to FIG. 1A and FIG. 3A, in some embodiments, when viewed in the top view, the wall structure 120 is ring-shaped, such as rectangular ring-shaped, but the disclosure is not limited thereto. In alternative embodiments, the wall structure 120 may be square ring-shaped, circular or oval ring-shaped, or the like, or any other suitable ring-shaped. In some embodiments, the wall structure 120 is formed to be enclosed and hollow ring-shaped.

The wall structure 120 includes a hole (e.g. through hole) 122 enclosed by inner sidewalls of the wall structure 120. The hole 122 may also be referred to as a cavity. In some embodiments, the wall structure 120 is disposed directly over the photonic element region 110 of the die 10, and the hole 122 may be directly over the photonic element (e.g. grating coupler) of the die 10. In some embodiments, the die 10 may include one or more corresponding holes (not shown) within the photonic element region 110 and directly underlying the hole 122 of the wall structure 120. The one or more holes in the photonic element region 110 may penetrate through the dielectric features and expose the photonic element (e.g. grating coupler) of the die 10. The hole 122 and/or the one or more holes in the photonic element region 110 may also be referred to as grating coupler (GC) holes. In some embodiments, the top view of the hole in the photonic element region 110 may be circular shaped, oval shaped, or the like or any other suitable shaped.

In some embodiments, as shown in FIG. 3A, a plurality of wall structures 120 may be formed on the die 10, and the plurality of wall structures 120 may be arranged as a line, a row, or an array or randomly arranged. The number and the arrangement of the wall structures 120 shown in the figures are merely for illustration, and the disclosure is not limited thereto. The number and the arrangement of the wall structures 120 may be adjusted according to product design and requirement.

As shown in FIG. 1A, in some embodiments, the wall structure 120 is formed to have a height higher than that of the die 20, but the disclosure is not limited thereto. In alternative embodiments, the height of the wall structure 120 may be substantially the same as or lower than the height of the die 20. In some embodiments, the top of the wall structure 120 includes a rounded or arced portion, but the disclosure is not limited thereto.

Figure 1B:
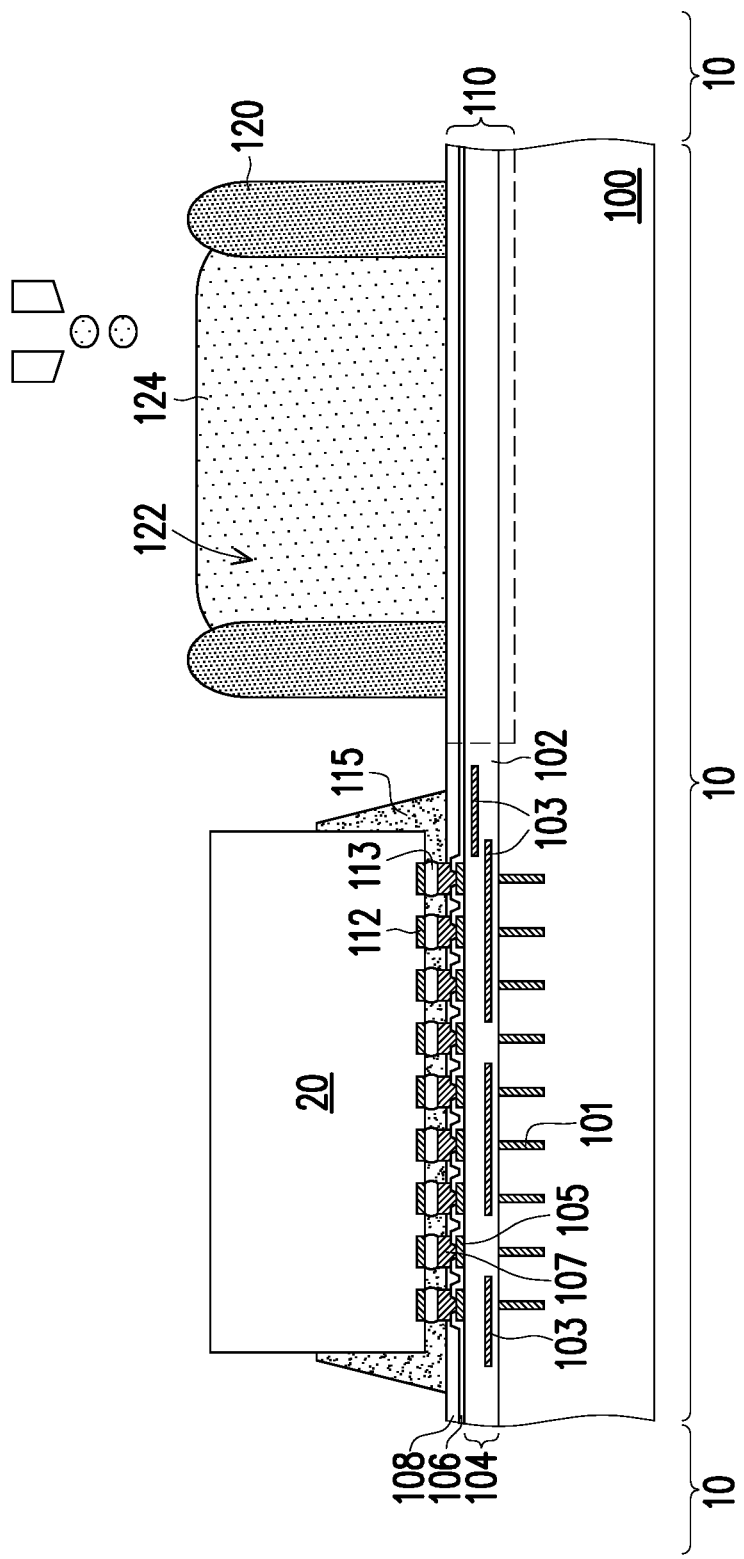

Referring to FIG. 1B, thereafter, a filling material 124 is formed to fill into the hole 122 of the wall structure 120. In some embodiments, the filling material 124 also fills into the GC holes of the die 10 underlying the hole 122. The filling material 124 may be different from the material of the wall structure 120. Alternatively, the filling material 124 may include material(s) similar to the material(s) of the wall structure 120, while the proportion of respective material(s) in the filling material 124 and the wall structure 120 are different, such that the filling material 124 and the wall structure 120 exhibit different properties. In some embodiments, the filling material 124 includes polymer, such as PI, acrylic, epoxy or the like or combinations thereof. The forming method of the filling material 124 may include dispensing and curing processes. In some embodiments, the filling material 124 is dispensed within and substantially fills up the hole 122 of the wall structure 120, and is not dispensed outside the outer sidewalls of the wall structure 120. The topmost surface of the filling material 124 may be slightly lower than or substantially coplanar with the topmost surface of the wall structure 120.

Figure 1C:
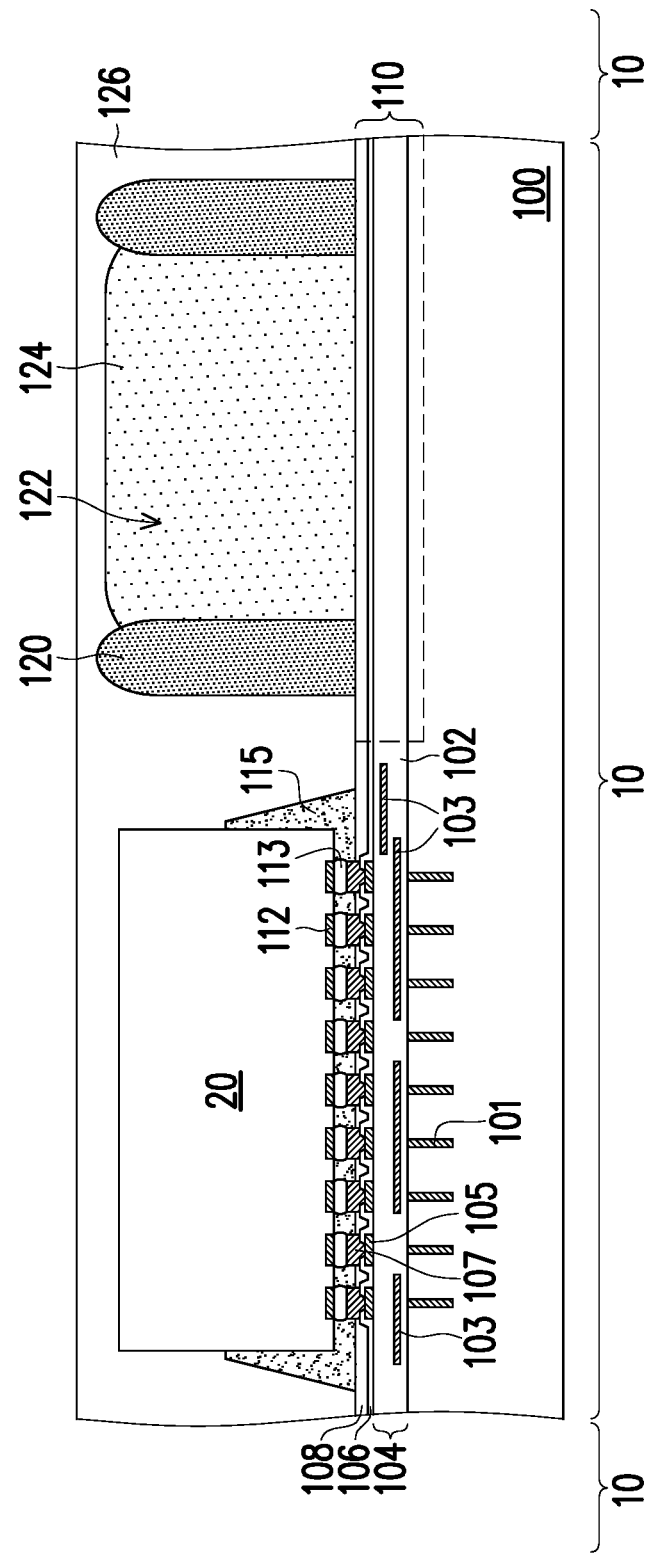

Referring to FIG. 1C, thereafter, an encapsulant 126 is formed on the die 10 to encapsulate the die 20, the underfill layer 115, the wall structure 120 and the filling material 124. The material of the encapsulant 126 is different from the filling material 124. In some embodiments, the encapsulant 126 includes a molding compound, a molding underfill, a resin such as epoxy, a combination thereof, or the like. In some other embodiments, the encapsulant 126 includes a photo-sensitive material such as polybenzoxazole (PBO), polyimide (PI), benzocyclobutene (BCB), a combination thereof, or the like. In alternative embodiments, the encapsulant 126 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 126 includes a molding compound which is a composite material including a base material (such as polymer) and a plurality of fillers distributed in the base material. The filler may be a single element, a compound such as nitride, oxide, or a combination thereof. For example, the fillers may include silicon oxide, aluminum oxide, boron nitride, alumina, silica, or the like, or combinations thereof. In some embodiments, the fillers are spherical particles, or the like. The cross-section shape of the filler may be circle, oval, or any other suitable shape. In some embodiments, the fillers include solid fillers, hollow fillers, or a combination thereof. In some embodiments, the encapsulant 126 is formed by an over-molding process and has a top surface higher than the top surfaces of the die 20, the wall structure 120 and the filling material 124.

Figure 1D:
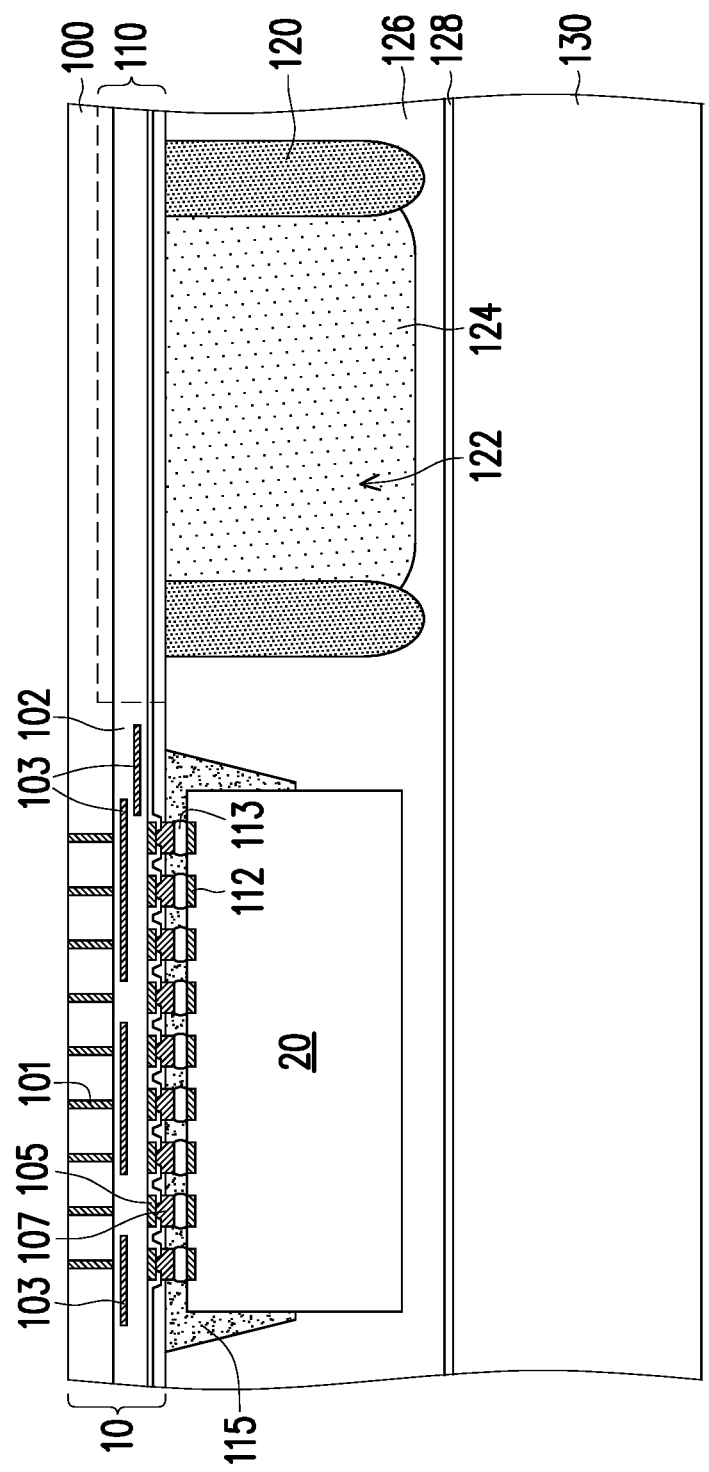

Referring to FIG. 1C and FIG. 1D, the structure shown in FIG. 1C is flipped upside down and attached to a carrier 130. In other words, the structure is attached to the carrier 130 with the surface of the encapsulant 126 facing the carrier 130. In some embodiments, the structure may be attached to the carrier 130 through an adhesive layer, such as die attach film (DAF). The carrier 130 may be a glass carrier, a ceramic carrier, or the like. The carrier 130 may include a release layer 128 formed thereon. In some embodiments, the release layer 128 may be formed of an adhesive such as an Ultra-Violet (UV) glue, a Light-to-Heat Conversion (LTHC) glue, or the like, or other types of adhesives. The release layer 128 may be decomposable under the heat of light to thereby release the carrier 130 from the overlying structures in subsequent processes.

Still referring to FIG. 1C and FIG. 1D, after attaching to the carrier 130, a back-side grinding process is performed to remove a portion of the substrate 100, so as to reveal the conductive vias 101. As such, the conductive vias 101 penetrate through the substrate 100 and may also be referred to as through substrate vias (TSVs).

Figure 1E:
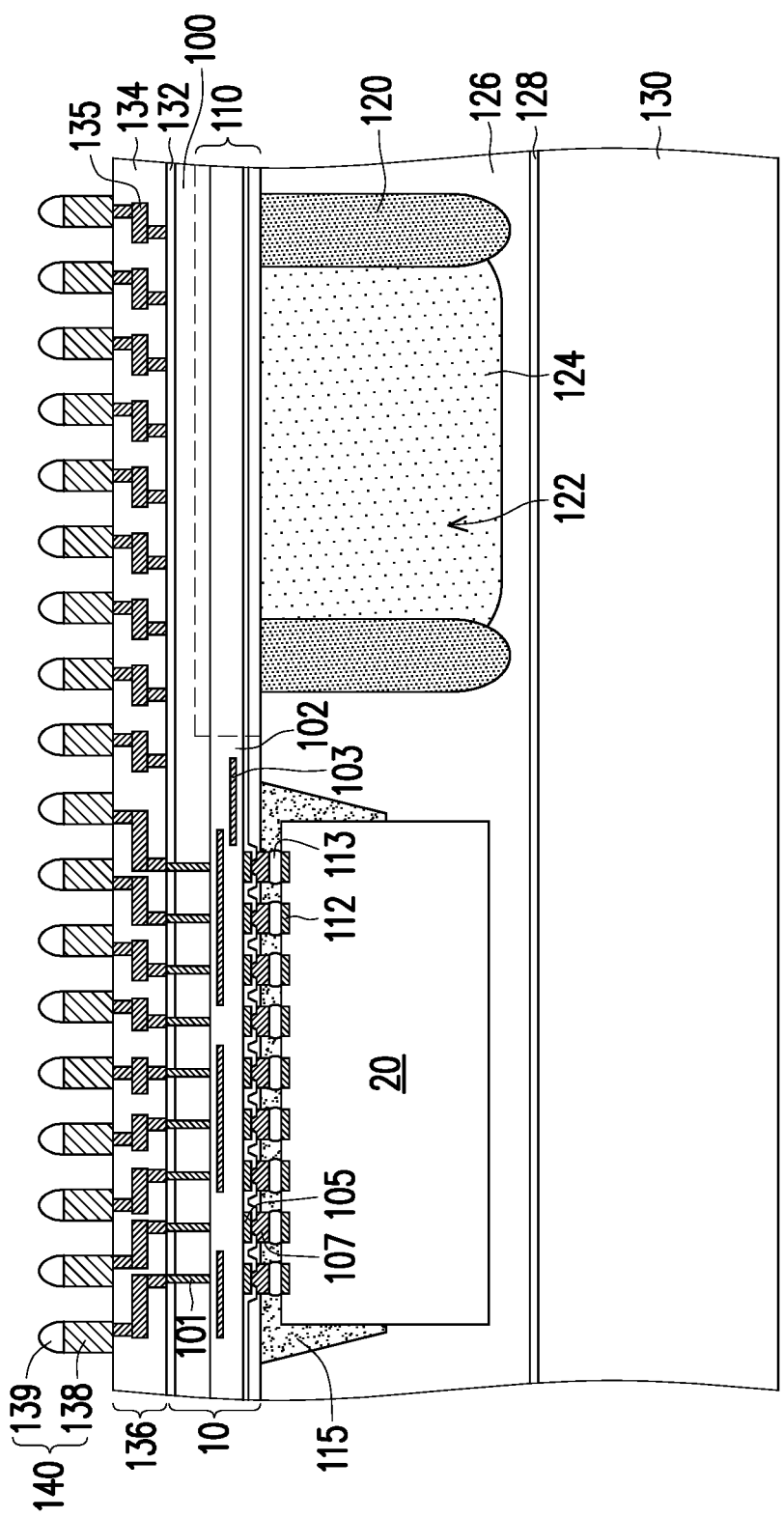

Referring to FIG. 1E, a redistribution layer (RDL) structure and conductive terminals are then formed on the die 10. In some embodiments, after the TSVs 101 are revealed and before the formation of RDL structure, the substrate 100 may further be recessed to have a top surface lower than the TSVs 101. Thereafter, a dielectric layer 132 may be formed on the substrate 100 and laterally surrounding the TSVs 101. The dielectric layer 132 may include silicon nitride, for example. In some embodiments, the formation of the dielectric layer 132 may include the following processes: a dielectric material layer is formed on the substrate 100 to cover sidewalls and top surfaces of the portions of the TSVs 101 protruding from the substrate 100 through a deposition process such as chemical vapor deposition (CVD), thereafter, a planarization process (e.g. chemical mechanical polishing (CMP)) is performed to remove excess portion of the dielectric material layer over the top surfaces of the TSVs 101, so as to reveal the TSVs 101 and form the dielectric layer 132 laterally aside the TSVs 101. In some embodiments, the top surface of the dielectric layer 132 is substantially coplanar with the top surfaces of the TSVs 101.

Thereafter, a redistribution layer (RDL) structure 136 is formed on and electrically connected to the die 10. The RDL structure 136 includes a dielectric structure 134 and redistribution layers 135 formed in the dielectric structure 134. The dielectric structure 134 may include a plurality of dielectric layers stacked upon one another. The material of the dielectric structure 134 may include organic dielectric and/or inorganic dielectric, or a combination thereof. The organic dielectric may include a polymer material such as polybenzoxazole (PBO), polyimide (PI), benzocyclobutene (BCB), or the like or combinations thereof. The inorganic dielectric may include silicon oxide, silicon nitride, silicon oxynitride, silicon carbide, or the like or combinations thereof. The redistribution layers 135 include conductive materials. The conductive materials include metal such as copper, nickel, titanium, or the like or combinations thereof. In some embodiments, the redistribution layers 135 include one or more layers of conductive traces and vias connected to each other. It is noted that, the numbers of the dielectric layers and redistribution layers of the RDL structure 136 are not limited in the disclosure.

The redistribution layers 135 penetrate through the dielectric structure 134 to electrically connect to the TSVs 101 of the die 10. In some embodiments, the presence of the dielectric layer 132 may help to avoid the metal diffusion from the redistribution layer 135 to the substrate 100.

Still referring to FIG. 1E, a plurality of connectors 140 are formed on the RDL structure 136 and electrically connected to the redistribution layer 135. The connectors 140 may include conductive bumps, solder balls, ball grid array (BGA) bump, controlled collapse chip connection (C4) bumps, or the like or combinations thereof. In some embodiments, the material of the connector 140 includes copper, aluminum, lead-free alloys (e.g., gold, tin, silver, aluminum, or copper alloys) or lead alloys (e.g., lead-tin alloys). The connectors 140 may be formed by ball mounting process, a C4 process, and/or other suitable processes. The connectors 140 are electrically connected to the die 10 through the RDL structure 136, and further electrically coupled to the die 20 through the die 10. In some embodiments, the connectors 140 may also be referred to as conductive terminals.

In an illustrative embodiment, the connector 140 includes a conductive bump 138 and a conductive cap 139 on the conductive bump 138. In an embodiment, the conductive bump 138 may be solder free and have substantially vertical sidewalls. For example, the conductive bump 138 may include copper bump. In some embodiments, a material of the conductive cap 139 includes nickel, tin, tin-lead, gold, silver, palladium, nickel-palladium-gold, nickel-gold, the like, or any combination thereof. In an embodiment, the conductive cap 139 may be solder cap.

Figure 1F:
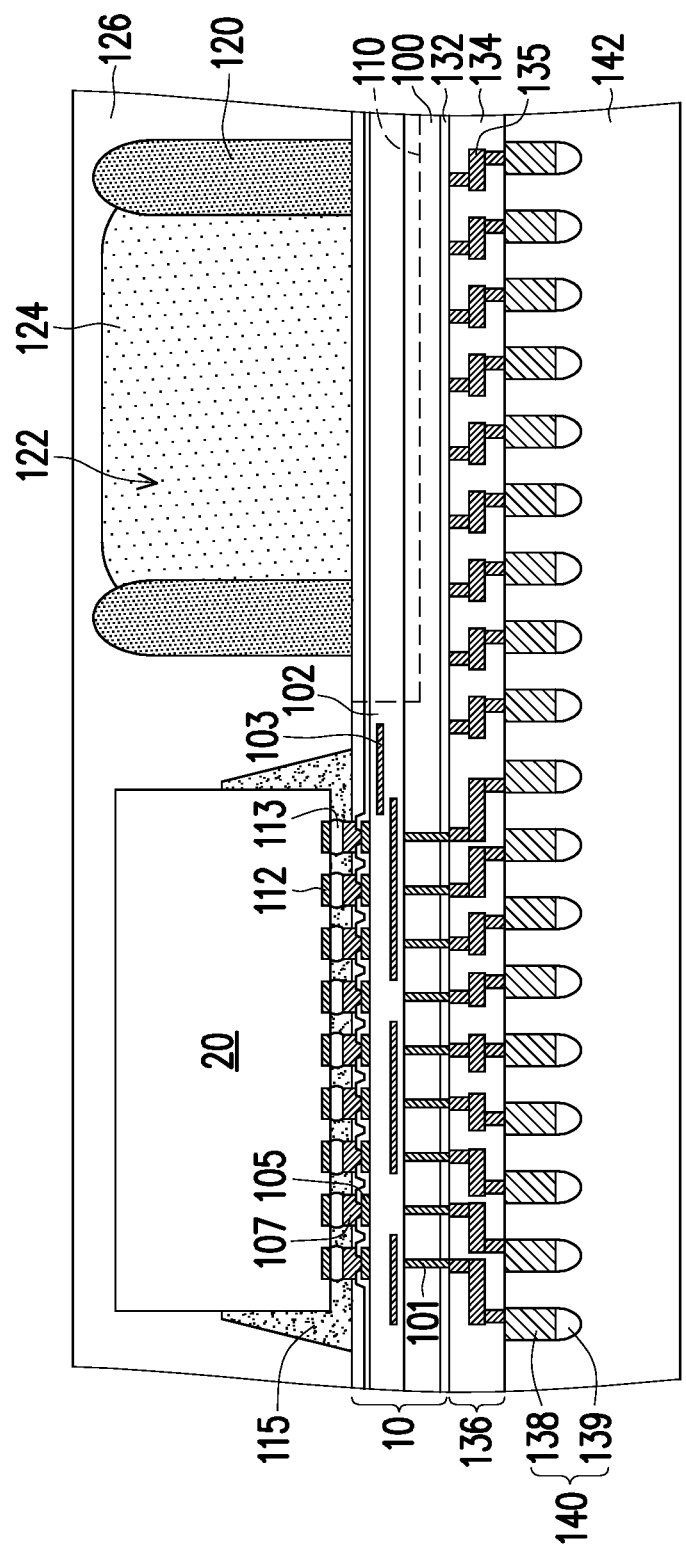

Referring to FIG. 1E and FIG. 1F, in some embodiments, the structure shown in FIG. 1E is flipped upside down and mounted to a tape (e.g. BG tape) 142. Thereafter, the release layer 128 is decomposed under the heat of light, and the carrier 130 is then released from the structure to expose the encapsulant 126. In some embodiments, the BG tape 142 includes polyethylene terephthalate (PET). The BG tape 142 may be optically translucent. In some embodiments, the BG tape 142 is removable after an exposure of UV light or a heat treatment.

Figure 1G:
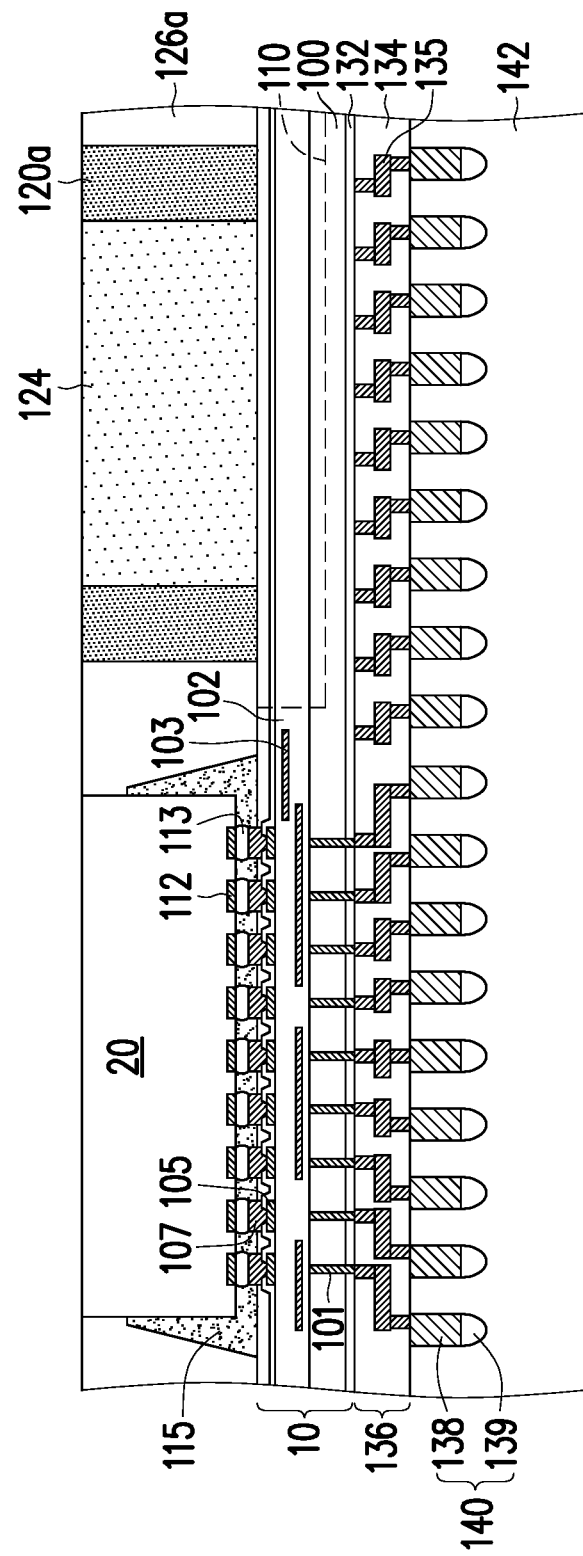

Referring to FIG. 1F and FIG. 1G, a planarization process is then performed, so as to expose the filling material 124. In some embodiments, portions of the encapsulant 126, the wall structure 120 and/or the filling material 124 may be removed by the planarization process. In some embodiments in which the wall structure 120 includes a rounded or arced portion, the rounded or arced portion may be removed (e.g. completely removed) by the planarization process, but the disclosure is not limited thereto. In some embodiments, portions of the die 20 may also be removed by the planarization process. The planarization process may include a CMP process, for example. After the planarization process is performed, the top surfaces of the die 20, the encapsulant 126a, the wall structure 120a and the filling material 124 may be planar and substantially coplanar with each other.

Figure 1H:
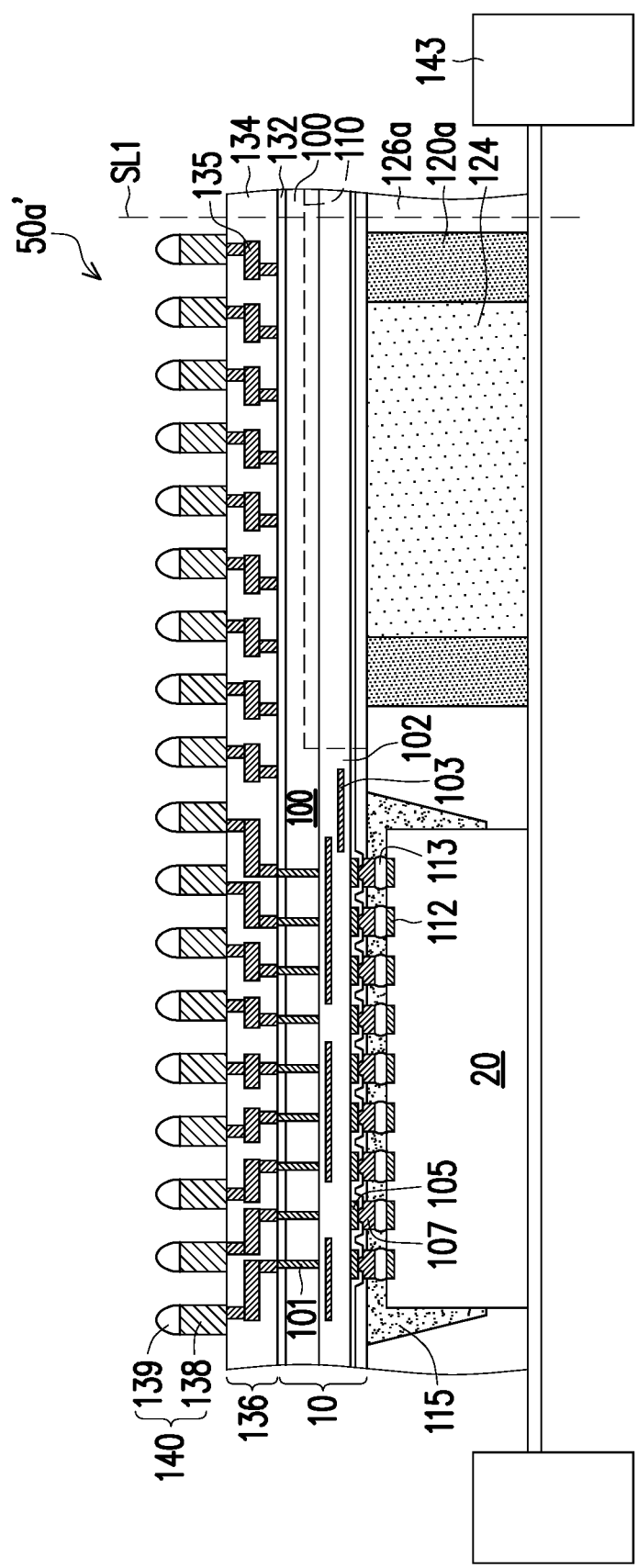

Referring to FIG. 1G and FIG. 1H, the structure shown in FIG. 1G is turned over and mounted to a frame tap 143, and the tape 142 is then removed from the structure (e.g. through a heat treatment or UV exposure). Thereafter, a singulation process is performed to form a plurality of substantially identical structures 50a'. The singulation process may be performed along the scribe line SL1. In some embodiments, the scribe line SL1 is configured outside the outer sidewall of the wall structure 120a and may pass through the encapsulant 126a, but the disclosure is not limited thereto. In alternative embodiments, the scribe line may be aligned with the interface between the wall structure 120a and the encapsulant 126a (not shown). The wall structure 120a may be substantially not removed during the singulation process, but the disclosure is not limited thereto. In alternative embodiments, the scribe line SL1 may pass through the wall structure 120a, and a portion of the wall structure 120a may be partially removed by the singulation process. It is noted that, merely the scribe line SL1 adjacent to the wall structure 120a is shown in the figure, while the scribe line adjacent to the die 20 which may pass through the encapsulant 126a is not shown in the figure for the sake of brevity.

Referring to FIG. 1H, in the embodiments in which the singulation process is performed along the scribe line SL1, the resulted structure 50a' may include the die 10, the die 20, the wall structure 120a, the filling material 124, the encapsulant 126a, the RDL structure 136 and the conductive terminals 140. In some embodiments, the wall structure 120a is ring-shaped (e.g. shaped as an enclosed wall), the outer sidewalls of the wall structure 120a are laterally surrounded by and in contact with the encapsulant 126a, and the filling material 124 is located within the hole 122 enclosed by inner sidewalls of the wall structure 120a. In other words, the filling material 124 is laterally surrounded by and in contact with the wall structure 120a.

Figure 1I:
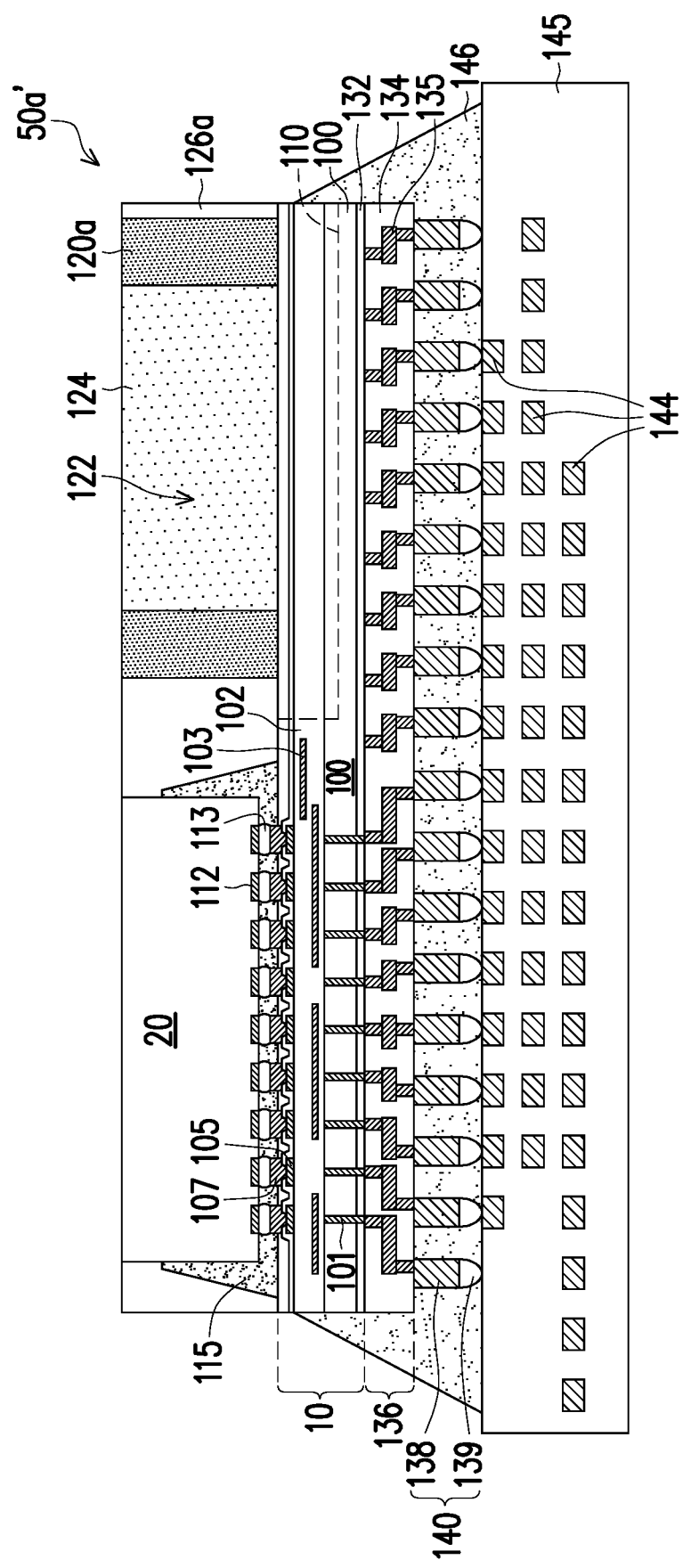

Referring to FIG. 1H and FIG. 1I, after the singulation process is performed, the structure 50a' is removed from the frame tape 143. Thereafter, the structure 50a' may be electrically coupled to other package component (e.g. package component 145) through the connectors 140. The package component 145 may be a circuit substrate, such as a printed circuit board (PCB). In some embodiments, the package component 145 includes a plurality of conductive features 144 which are electrically connected to the connectors 140 of the structure 50a'.

In some embodiments, an underfill layer 146 is formed to fill the space between the structure 50a' and the package component 145 by, for example, dispensing and curing processes. The underfill layer 146 laterally surrounds the connectors 140. In some embodiments, the underfill layer 146 may further extend to cover the sidewalls of the RDL structure 136 and/or the sidewalls of the die 10.

Figure 1J:
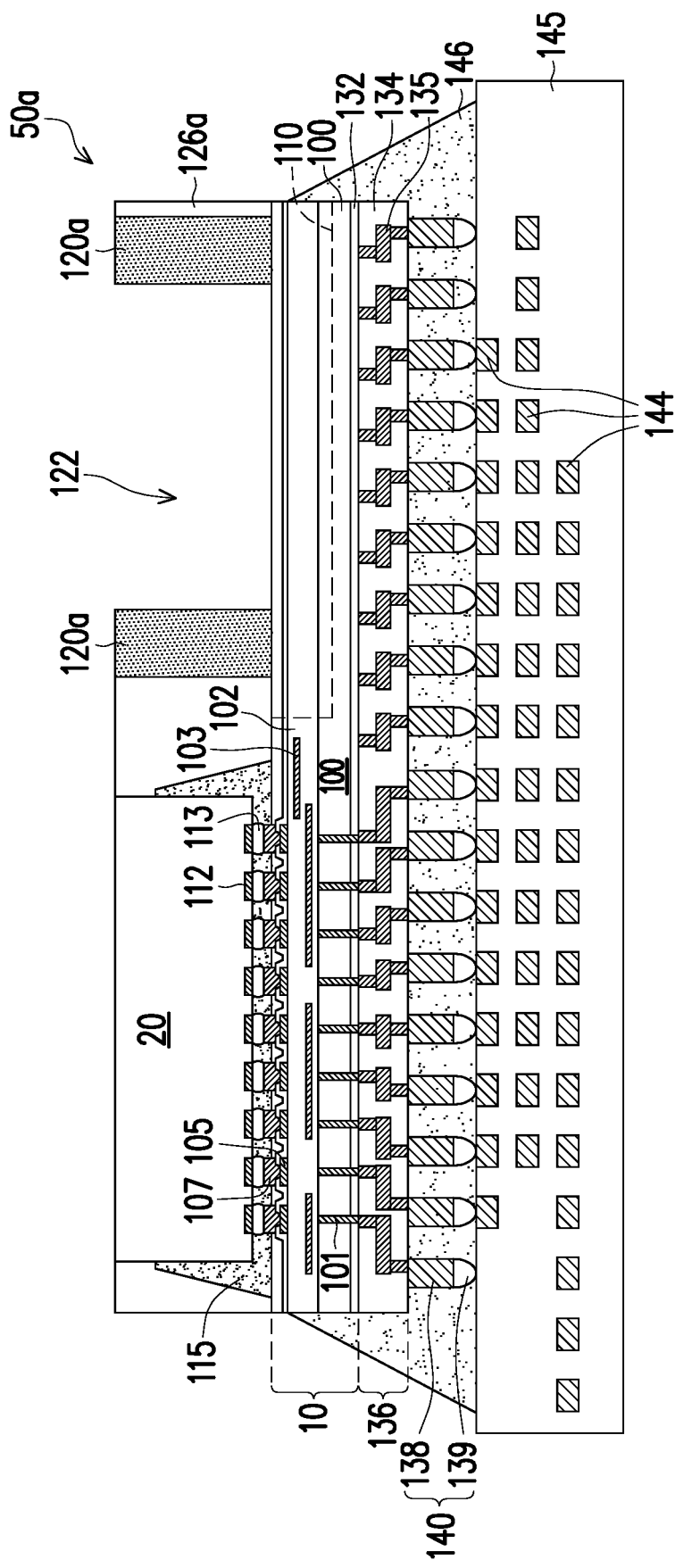

Referring to FIG. 1I and FIG. 1J, thereafter, the filling material 124 is removed, such that the hole 122 of the wall structure 120a (and the holes in the photonic element region 110 of the die 10) are unfilled and revealed for optical element insertion, and a package structure 50a is thus formed. In some embodiments, the filling material 124 is removed by wet and/or dry cleaning process. The wet and/or dry cleaning process utilize cleaning agent exhibiting a high removal selectivity ratio of the filling material 124 to the adjacent materials (e.g. the wall structure 120a, the encapsulant 126a, the die 20), such that the filling material 124 is substantially completely removed by the cleaning process, while the wall structure 120a, the encapsulant 126a and the die 20 are substantially not consumed during the removal of the filling material 124. In some embodiments, the cleaning agent used for the wet cleaning process may include KOH, water or the like, or combinations thereof; the cleaning agent (e.g. chemical gas) used for the dry cleaning process may include $O_2$, $CF_4$, Ar, or the like or combinations thereof.

In the embodiments of the disclosure, since the removal of filling material 124 and reveal of the hole 120a are performed after the singulation process, some advantages may be achieved. For example, if the hole 120a is revealed before performing the singulation process, fillers of the encapsulant may fall into the GC holes during the singulation process, which may negatively affect the subsequently optical element insertion. In the embodiments of the disclosure, since the GC holes are protected by the filling material 124 and/or the wall structure 120a during the singulation process, the above-described issue is avoided, and clean GC holes may be obtained for optical element insertion. In addition, the wall structure 120a is used to obtain good sidewall shape which is also benefit for the subsequently optical element insertion. For example, the wall structure 120a formed by dispensing process may include substantially straight and smooth sidewalls.

Figure 1K:
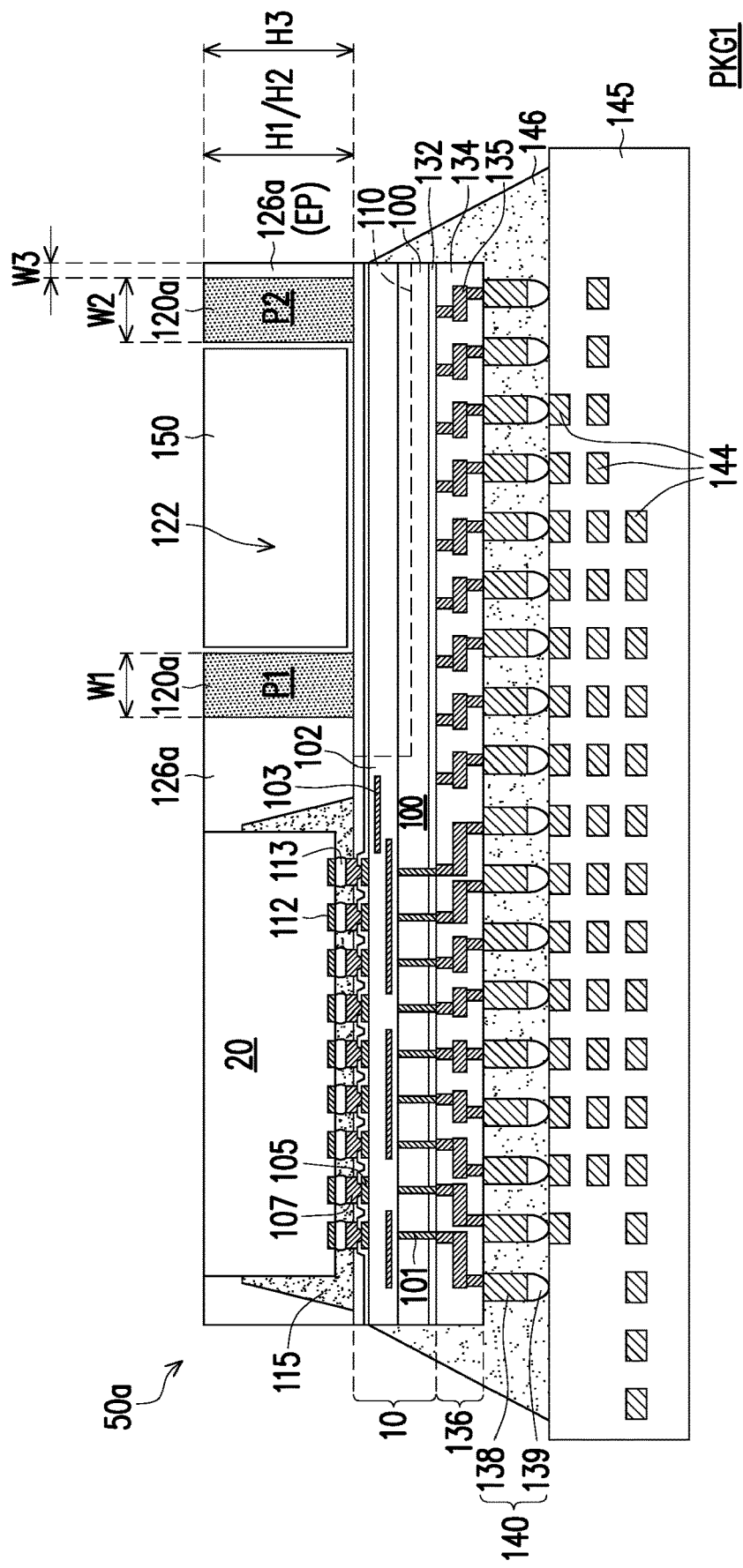

Referring to FIG. 1K, in some embodiments, an optical element 150 is inserted into the hole 122 of the wall structure 120a, so as to be optically coupled to the optical elements (such as, grating coupler, waveguide, modulator) in the region 110 of the die 10. The optical element 150 may include coupler, optical fiber(s), or the like, or combinations thereof. In some embodiments, the optical element 150 includes engaging element(s), or the like (e.g. protrusions) which are configured for engaging with the GC holes that are disposed in the region 110 of the die 10 and underlying the hole 122, so as to implement the optical element insertion. It is noted that, the shape, size, structure and position of the optical element 150 shown in the figures are merely for illustration, and the disclosure is not limited thereto. In some embodiments, some portions of the optical element 150 are in physical contact with the die 10 and/or the wall structure 120, while other portions of the optical element 150 may be spaced from the die 10 and/or the wall structure 120. In some embodiments, additional material (not shown), such as optical adhesive may be used to fix the optical element 150 onto the package structure 50a. In the present embodiment, the optical element 120 is inserted into the hole 122 from the top of the package structure 50a, and such configuration may also be referred to as top-insertion configuration.

As such, a package structure PKG1 is thus formed. The package structure PKG1 includes a package structure 50a on the substrate 145. In some embodiments, the package structure 50a includes the die 10, the die 20, the wall structure 120a, the encapsulant 126a, the RDL structure 136 and the conductive terminals 140. The package structure 50a further includes the optical elements laterally aside the die 20 and mounted on the die 10. In some embodiments, the die 10 is a photonic die, and the die 20 is an electronic die which is electrically coupled to the photonic die. The optical element 150 is laterally surrounded by the wall structure 120a and optically coupled to the die 10. The package structure PKG1 may also be referred to as a chip-on-wafer-on-substrate (CoWoS) package structure or a CoWoS photonic device, and the die 10 may be referred to as an interposer.

FIG. 3B is a top view of the package structure 50a illustrating the position relation of the wall structure 120a, the encapsulant 126a and the optical element 150. It is noted that, the die 20 is not shown in the top view for the sake of brevity, and the sizes of the elements in the top view are not drawn to scale.

Referring to FIG. 1K and FIG. 3B, in some embodiments, the wall structure 120a is ring-shaped, such as a close ring-shaped wall. Although a rectangular ring-shaped wall structure 120a is illustrated in FIG. 3B, the disclosure is not limited thereto. The wall structure 120a may also be square ring-shaped, circular ring-shaped, oval ring-shaped, or the like, or any other suitable ring-shaped. The wall structure 120a is laterally surrounded by and in physical contact with the encapsulant 126a. In some embodiments, each side (e.g. each of the four outer sidewalls) of the wall structure 120a is laterally covered by and in physical contact with the encapsulant 126a. The material of the wall structure 120a may be different from the encapsulant 126a, and interfaces are existed between the wall structure 120a and the encapsulant 126a. In some embodiments, the encapsulant 126a includes a base material and fillers, while the wall structure 120a is a polymer wall free of fillers. The wall structure 120a may include a substantially homogenous material in its entire structure (e.g. from bottom to top). However, the disclosure is not limited thereto.

In some embodiments, the bottom surface of the wall structure 120a is substantially coplanar with the bottom surface of the encapsulant 126a and in direct contact with the die 10. There may be free of gap or any other additional material (e.g. adhesive material) between the wall structure 120a and the die 10. The top surface of the wall structure 120a may be substantially coplanar with the top surface of the encapsulant 126a, but the disclosure is not limited thereto.

In some embodiments, as shown in FIG. 1K, the wall structure 120a includes a first portion P1 and a second portion P2 which are two opposite sides of the wall structure 120a. The first portion P1 is closer to the die 20 than the second portion P2, and the second portion P2 is adjacent to the edge of the package structure 50a. In some embodiments, the sizes (e.g. width, height) of the four sides of the wall structure 120a may be the same or different. For example, the size (e.g. width W1 or height H1) of the first portion P1 may be substantially the same as or different from the size (e.g. width W2 or height H2) of the second portion P2. The height H1/H2 of the wall structure 120a may be substantially equal to the height H3 of the encapsulant 126a, but the disclosure is not limited thereto. In some other embodiments, the height H1/H2 of the wall structure 120a may be less than or larger than the height H3 of the encapsulant 126a. In some embodiments, the width W1/W2 of the wall structure 120a may be in a range of 30 μm to 700 μm, the height H1/H2 of the wall structure 120a may be in a range of 50 μm to 900 μm.

In some embodiments, the encapsulant 126a includes an edge portion EP covering sidewall of the second portion P2 of the wall structure 120a. The width W3 of the edge portion EP may be less than, equal to or larger than the width W2 of the second portion P2 (or the width W1 of the first portion P1) of the wall structure 120a.

In some embodiments, the optical element 150 is disposed in the through hole 122 of the wall structure 120a and optically coupled to the die 10. The optical element 150 is laterally surrounded by inner sidewalls of the wall structure 120a and laterally spaced from the encapsulant 126a by the wall structure 120a therebetween.

FIG. 2A to FIG. 2D are schematic cross-sectional views illustrating a method of forming a package structure according to a second embodiment of the disclosure. The second embodiment is similar to the first embodiment, except that the scribe line for the singulation process is configured at different position.

Figure 2A:
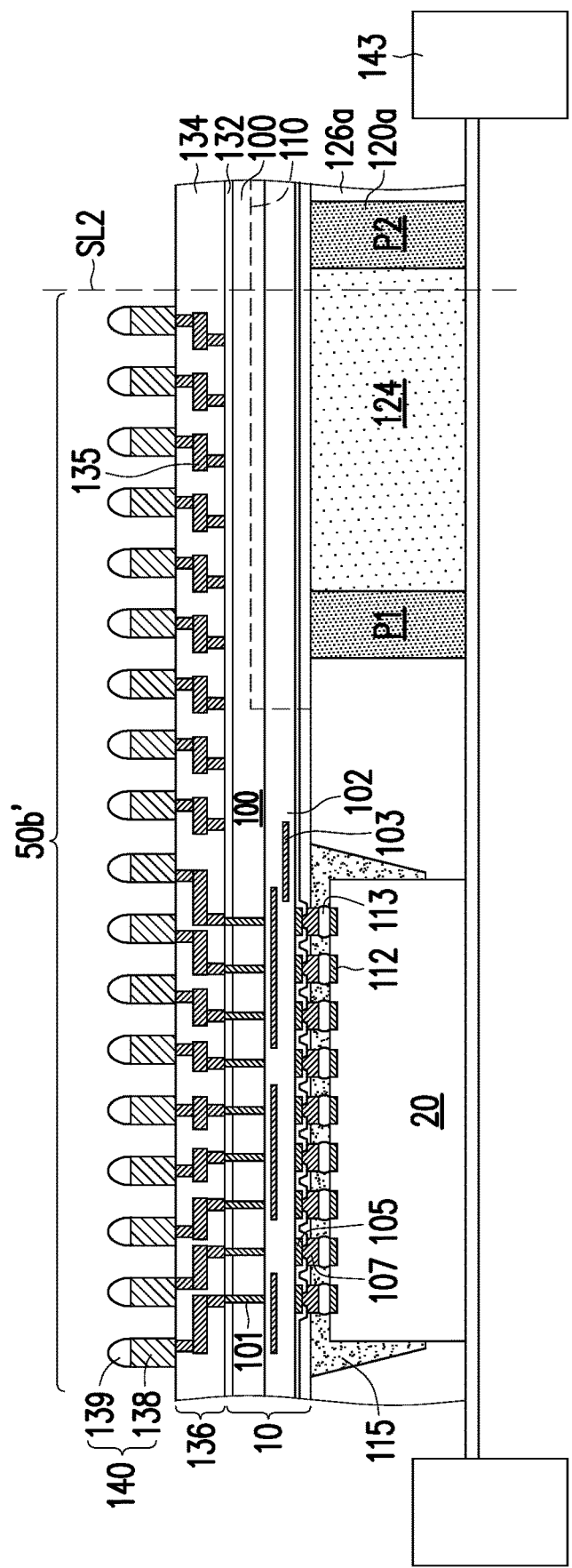
FIG. 2A to FIG. 2D are schematic cross-sectional views illustrating a method of manufacturing a package structure according to a second embodiment of the disclosure.

Referring to FIG. 2A, in some embodiments, the singulation process is performed along a scribe line SL2 which is configured at a position different from the scribe line SL1 shown in FIG. 1H. In some embodiments, the scribe line SL2 is between the inner sidewalls of the wall structure 120a and may pass through the filling material 124. In alternative embodiments, the scribe line SL2 may be aligned with the interface between the inner sidewall of second portion P2 of the wall structure 120a and the filling material 124.

Figure 2B:
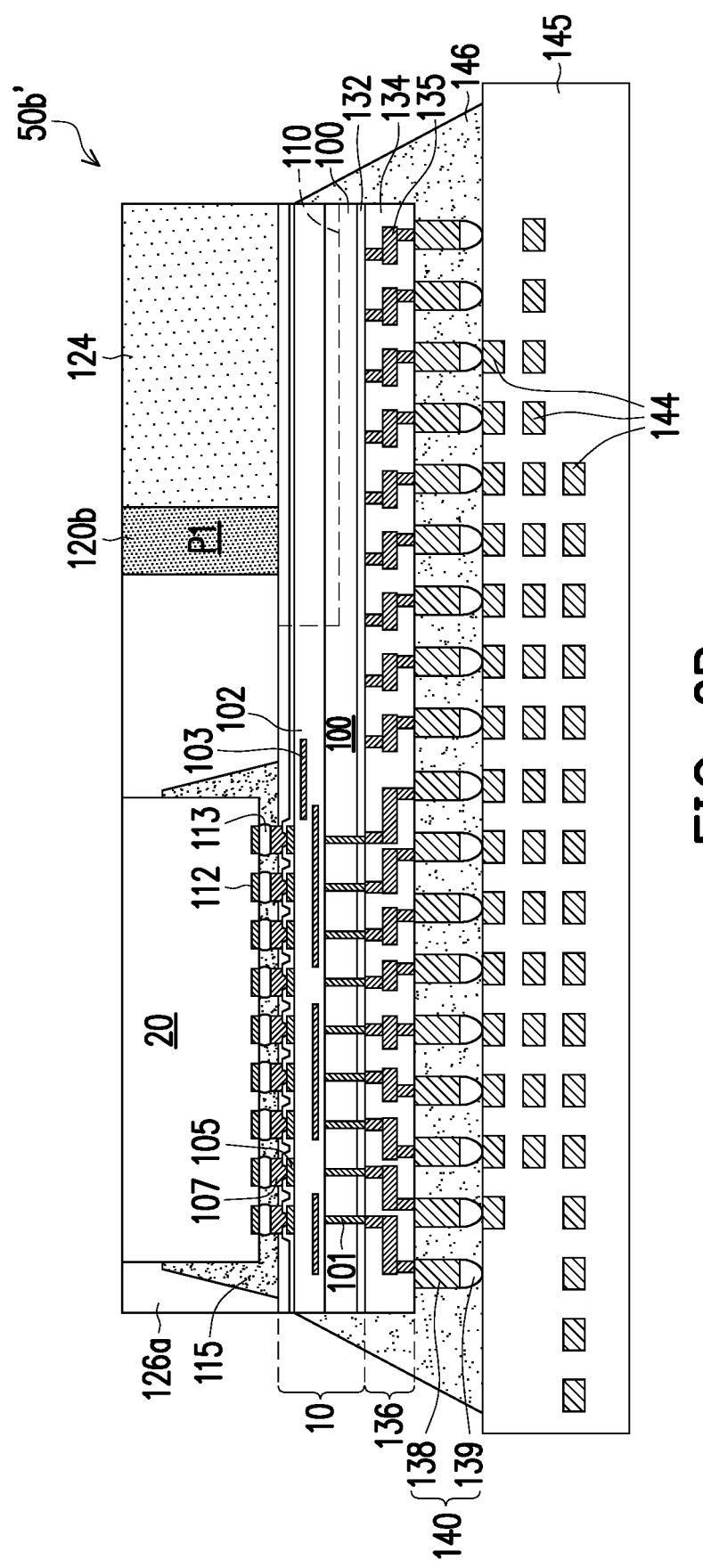

Referring to FIG. 2A and FIG. 2B, the singulation process is performed along the scribe line SL2, so as to form a plurality of package structures 50b'. The singulation process includes performing a wafer dicing process or a blade cutting process. In some embodiments, a portion P2 of the wall structure 120a, a portion of the encapsulant 126 covering the portion P2 of the wall structure 120a, and a portion of the filling material 124 are removed by the singulation process, and a wall structure 120b and an encapsulant 126b are formed. In some alternative embodiments in which the scribe line SL2 is along the interface between the portion P2 of the wall structure 120a and the filling material 124, the singulation process may remove the portion P2 of the wall structure 120b, while the filling material 124 is substantially not removed during the singulation process. In some embodiments, before the singulation process, the wall structure 120a is a close ring-shaped wall structure, and after the portion P2 is removed by the singulation process, the obtained wall structure 120b becomes an open ring-shaped wall structure.

Figure 5:
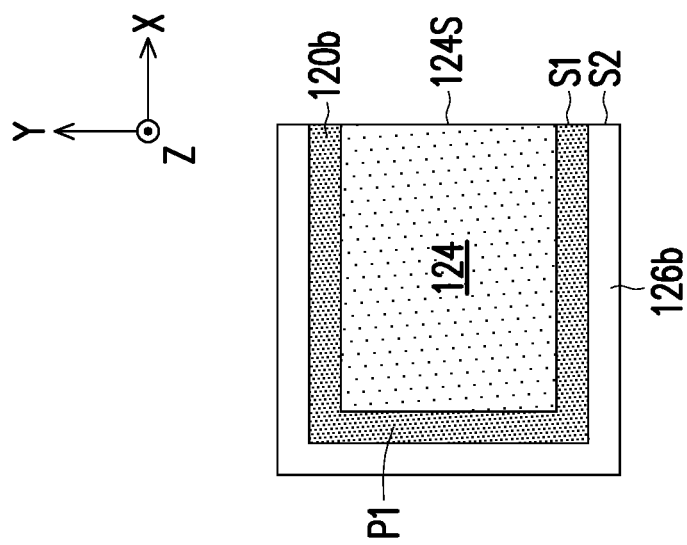
FIG. 5 illustrates a top view of an encapsulant, a wall structure and a filling material of an intermediate stage in the manufacturing of a package structure according to some embodiments of the disclosure.

Referring to FIG. 2B, after the singulation process is performed, the wall structure 120b becomes an open ring-shaped wall structure, and a sidewall 124s of the filling material 124 is exposed. FIG. 5 illustrates a top view of the wall structure 120b, the encapsulant 126b and the optical element 150 of FIG. 2B. When viewed in the top view FIG. 5, three sides of the filling material 124 are laterally surrounded and covered by the wall structure 120b, while the other side (the sidewall 124s) of the filling material 124 is exposed. In some embodiments, the sidewall 124s of the filling material 124 is substantially aligned with or coplanar with the trim sidewalls S1 of the wall structure 120b and the sidewall S2 of the encapsulant 126b along a YZ plane perpendicular to the top surface of the die 10.

Thereafter, the structure 50b' is bonded to the package component 145, and an underfill layer 146 is formed to fill the space between the structure 50b' and the package component 145.

Figure 2C:
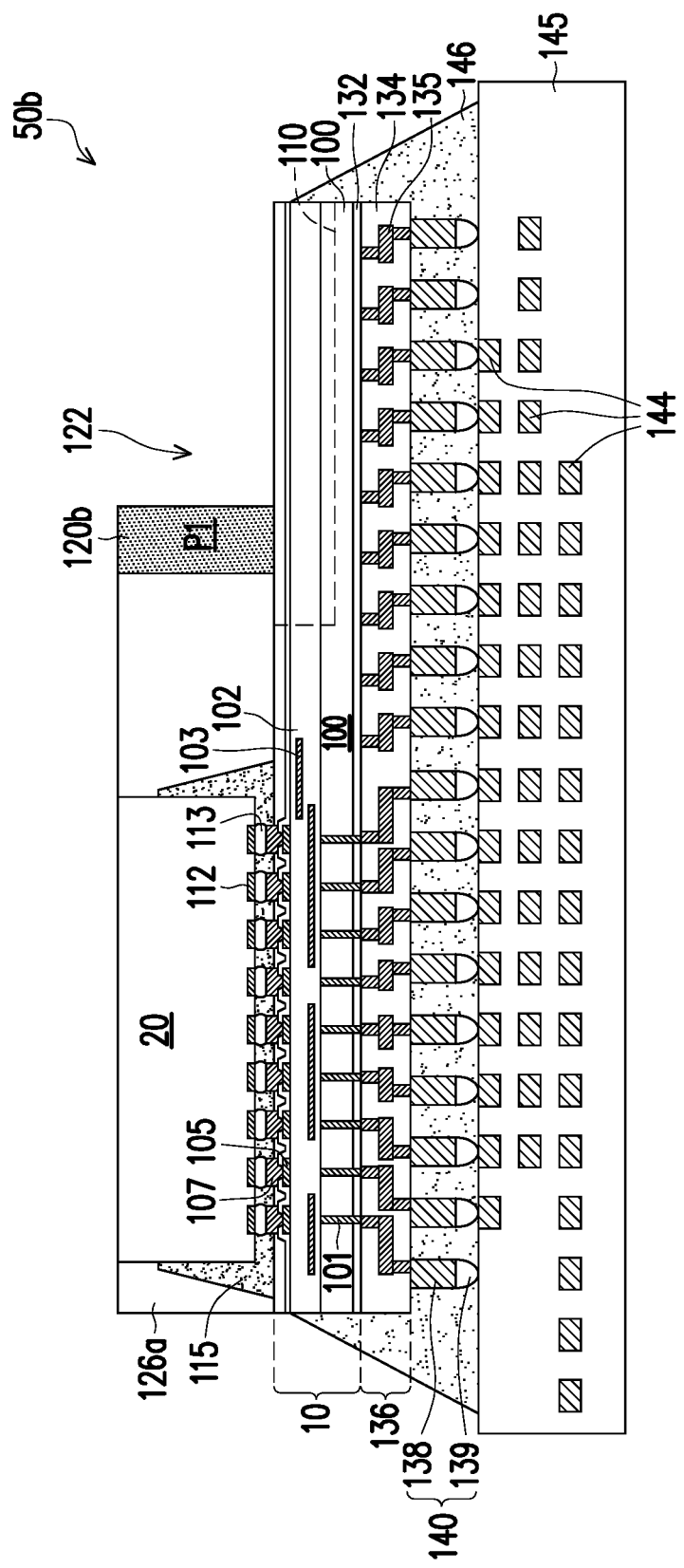

Referring to FIG. 2B and FIG. 2C, the filling material 124 is then removed by a cleaning process, and a hole 122a defined by the wall structure 120b is revealed for optical element insertion, and a package structure 50b on substrate 145 is formed. In the present embodiment, since the portion P2 (FIG. 2A) is removed during the singulation process, the enclosed wall structure is open.

Figure 2D:
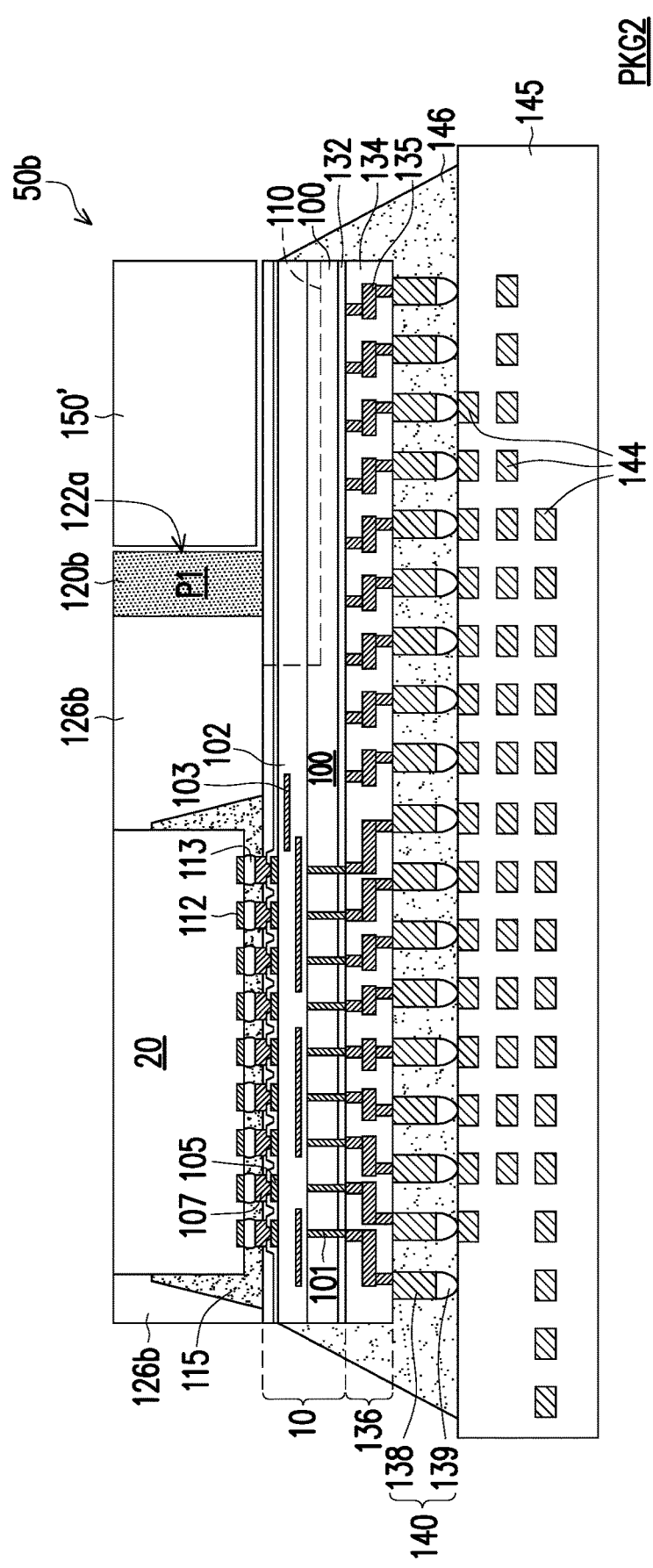

Referring to FIG. 2C and FIG. 2D, an optical element 150' is then inserted into the hole 122a of the wall structure 120b to optically couple to the die 10. In some embodiments, the optical element 150' is inserted into the hole 122a from the lateral side, and such configuration may also be referred to as side-insertion configuration. As such, a package structure PKG2 is formed. In some embodiments, the package structure PKG2 includes the package structure 50b on the substrate 145. The package structure PKG2 is similar to the package structure PKG1, except that the wall structure 120b is open ring-shaped and configured for side insertion of the optical element 150'.

FIG. 3C is a top view of the package structure 50b illustrating the position relation of the wall structure 120b, the encapsulant 126b and the optical element 150'. It is noted that, the die 20 is not shown in the top view for the sake of brevity, and the sizes of the elements in the top view are not drawn to scale.

Referring to FIG. 2D and FIG. 3C, in some embodiments, the wall structure 120b is not enclosed. For example, the wall structure 120b may be open or partial ring-shaped, U-shaped, or the like. In some embodiments, the wall structure 120b is open rectangular ring-shaped, so that the wall structure 120b includes three outer sidewalls, three inner sidewalls and two trim sidewalls S1 connecting the outer sidewalls with the inner sidewalls of the wall structure 120b. The trim sidewalls S1 are located at the opening of the open ring-shaped wall structure. The three outer sidewalls of the wall structure 120b are surrounded by and in physical contact with the encapsulant 126b. As the wall structure 120b is an open ring-shaped wall, the trim sidewalls S1 of the wall structure 120b are not covered by the encapsulant 126b and the exposed surfaces of the trim sidewalls S1 may be substantially aligned with or coplanar with the sidewall S2 of the encapsulant 126b along a YZ plane perpendicular to the top surface of the die 10. The sizes (e.g. width, height) of the wall structure 120b and/or the size (e.g. height) of the encapsulant 126b may be in a substantially the same range of those described in the first embodiment, which are not described again here.

The wall structure 120b includes a hole 122a defined by inner sidewalls thereof, and the optical element 150' is disposed in the hole 122a to be optically coupled to the die 10. In some embodiments, three sides of the optical element 150' are laterally surrounded by the wall structure 120b, while the other sidewall is exposed and may be substantially aligned with or laterally offset from the sidewall S1 of the wall structure 120b and/or the sidewall S2 of the encapsulant 126b.

Figure 4A:
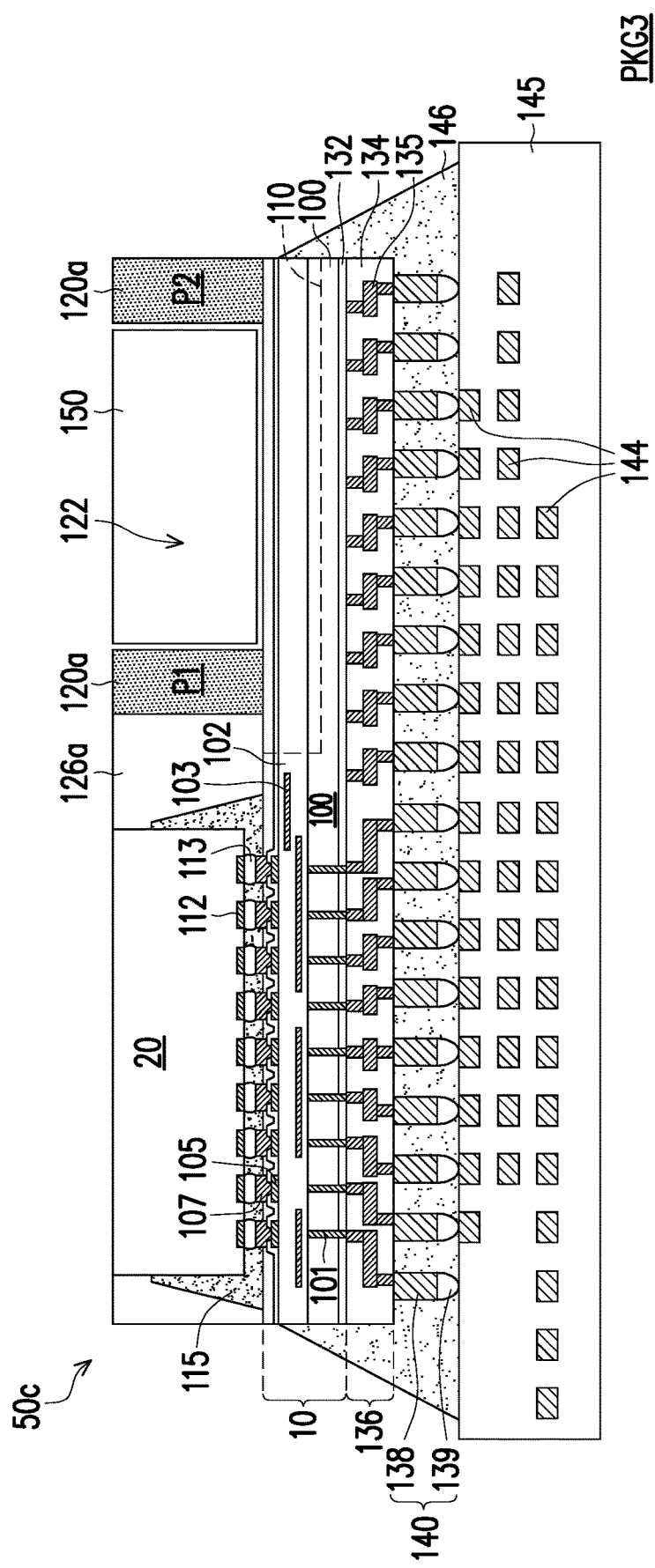
FIG. 4A is a schematic cross-sectional view illustrating a package structure according to alternative embodiments of the disclosure.
Figure 4B:
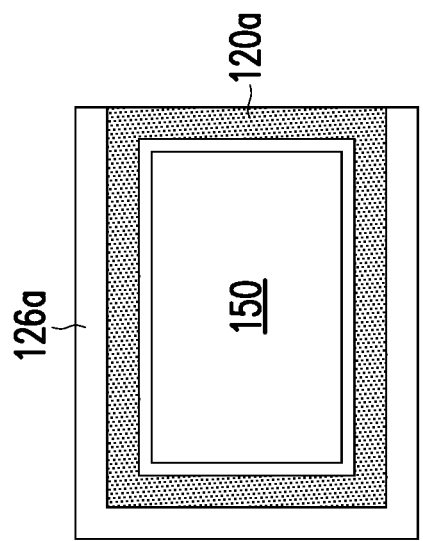
FIG. 4B is a partial top view of a package structure according to alternative embodiments of the disclosure.

FIG. 4A illustrates a cross-sectional view of a package structure PKG3 according some alternative embodiments of the disclosure. FIG. 4B is top view of a package structure 50c included in the package structure PKG3 according to the alternative embodiments of the disclosure. The formation of the package structure PKG3 is similar to that of the package structure PKG1, except that the scribe line SL1 (FIG. 1H) for the singulation process of the package structure 50c is aligned with an interface between the wall structure 120a and the encapsulant 126a or pass through the wall structure 120a.

Referring to FIG. 4A and FIG. 4B, in some embodiments, the wall structure 120a is ring-shaped, such as a close ring-shaped wall. The wall structure 120a may include four sides, wherein three sides of the wall structure 120a are laterally surrounded by the encapsulant 126a, while the other side of the wall structure 120a is exposed. In some embodiments, the sidewall of the portion P2 of the wall structure 120a is exposed by the encapsulant 126a and may be substantially aligned with the sidewall of the encapsulant 126a in a direction parallel with the top surface of the die 10.

In the embodiments of the disclosure, a non-removable polymer wall and removal polymer filling material are used for forming a cavity structure which is configured for optical element insertion. The polymer filling material is removed by cleaning process after the singulation process is performed. Therefore, the photonic element (e.g. grating coupler) of the photonic die and GC holes may be well protected by the polymer wall and the filling material during the manufacturing process. The issue of encapsulant particles (e.g. fillers) falling into the GC holes during singulation process is thus avoided. As such, clean GC holes could be obtained for top-insertion structure or side-insertion structure. In addition, a good shape for optical element insertion may be obtained due to polymer wall formation, and a large process integrate window for CoWoS photonic device may be achieved. The manufacturing process of the embodiments is simplified and manufacturing cost is reduced, thereby improving the manufacturing yield.

In accordance with some embodiments of the disclosure, a package structure includes a first die, a second die, a wall structure and an encapsulant. The second die is electrically bonded to the first die. The wall structure is laterally aside the second die and on the first die. The wall structure is in contact with the first die and a hole is defined within the wall structure for accommodating an optical element insertion. The encapsulant laterally encapsulates the second die and the wall structure.

In accordance with alternative embodiments of the disclosure, a package structure includes a photonic die, an electronic die, a polymer wall, an encapsulant and an optical element. The electronic die is electrically bonded to the photonic die. The polymer wall is disposed on the photonic die. The encapsulant laterally encapsulates the electronic die and the polymer wall. The optical element is laterally surrounded by the polymer wall and optically coupled to the photonic die.

In accordance with some embodiments of the disclosure, a method of forming a package structure includes: electrically bonding a second die to a first die; forming a wall structure on the first die and laterally aside the second die, wherein a through hole is defined by inner sidewalls of the wall structure and exposes the first die; forming a filling material to fill the through hole within the wall structure; forming an encapsulant to encapsulate the second die, the wall structure and the filling material; and removing the filling material to reveal the through hole within the wall structure for accommodating an optical element.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of forming a package structure, comprising:
   providing a first die;
   electrically bonding a second die to the first die;
   forming a wall structure on the first die and laterally aside the second die, wherein a through hole exposing the first die is defined by inner sidewalls of the wall structure;
   forming a filling material to fill the through hole within the wall structure;
   forming an encapsulant to laterally encapsulate the second die, the wall structure and the filling material; and
   removing the filling material to reveal the through hole.

2. The method of claim 1, wherein the wall structure and the filling material are formed of different polymer materials and formed by dispensing processes.

3. The method of claim 1, further comprising performing a singulation process before removing the filling material.

4. The method of claim 3, wherein the singulation process is performed cutting through the encapsulant without cutting through the wall structure.

5. The method of claim 3, wherein the singulation process is performed cutting through the encapsulant and cutting through the filling material, and a portion of the wall structure and a portion of the encapsulant covering the portion of the wall structure are removed by the singulation process.

6. The method of claim 1, further comprising inserting an optical element into the through hole after removing the filling material.

7. The method of claim 1, wherein the wall structure is not removed during removing the filling material.

8. A method of forming a package structure, comprising:
   bonding a semiconductor die to a semiconductor wafer;
   forming an enclosed polymeric wall on the semiconductor wafer beside the semiconductor die, wherein the enclosed polymeric wall is hollow ring-shaped with an opening exposing the semiconductor wafer;
   forming a filling material into the enclosed polymeric wall and filling into the opening;
   forming an encapsulant on the semiconductor wafer to at least laterally encapsulate the semiconductor die, the enclosed polymeric wall and the filling material;
   performing a singulation process; and
   removing the filling material.

9. The method of claim 8, further comprising performing a thinning process to the semiconductor wafer to form an interposer before performing the singulation process.

10. The method of claim 9, further comprising forming a redistribution structure on the interposer.

11. The method of claim 8 wherein the singulation process is performed cutting through the encapsulant without cutting through the enclosed polymeric wall, and the enclosed polymeric wall is not damaged.

12. The method of claim 11, further comprising inserting an optical element into the opening encircled by the enclosed polymeric wall after removing the filling material to reveal the opening.

13. The method of claim 8, wherein the singulation process is performed cutting through the encapsulant and cutting through the enclosed polymeric wall and through the filling material, so that a portion of the enclosed polymeric wall, a portion of the filling material and a portion of the encapsulant are removed by the singulation process, and the enclosed polymeric wall becomes an open polymeric wall.

14. The method of claim 13, wherein removing the filling material includes removing a portion of the filling material remained in the open polymeric wall to reveal a hole defined by the open polymeric wall, and the method further comprises laterally inserting an optical element into the hole after removing the filling material.

15. The method of claim 8, wherein forming an enclosed polymeric wall on the semiconductor wafer comprises performing a dispensing process to dispense a polymer material on the semiconductor wafer and performing a curing process to cure the polymer material.

16. The method of claim 15, wherein forming a filling material into the enclosed polymeric wall comprises dispensing the filling material within the opening and substantially filling up the opening, and the filling material and the polymer material are different materials.

17. A method of forming a package structure, comprising:
providing an interposer having conductive vias;
bonding a semiconductor die to the conductive vias of the interposer;
forming a polymeric wall on the interposer beside the semiconductor die, wherein the polymeric wall is hollow ring-shaped with an opening exposing the semiconductor wafer;
forming a filling material to fill up the opening;
forming an insulating encapsulant on the interposer to encapsulate the semiconductor die, the polymeric wall and the filling material;
performing a thinning process to a backside of the interposer to expose the conductive vias;
forming a redistribution structure on the interposer and on the exposed conductive vias;
performing a singulation process to the redistribution structure and the interposer; and
removing the filling material.

18. The method of claim 17, further comprising performing a planarization process to remove the insulating encapsulant until the filling material is exposed before performing the singulation process.

19. The method of claim 17, wherein performing a singulation process comprises performing a dicing process cutting through the redistribution structure, the interposer and the insulating encapsulant without cutting the polymeric wall.

20. The method of claim 17, wherein performing a singulation process comprises performing a dicing process cutting through the redistribution structure and the interposer and cutting through the insulating encapsulant and the polymeric wall.

* * * * *